(12) United States Patent
Sun et al.

(10) Patent No.: US 9,595,493 B2
(45) Date of Patent: Mar. 14, 2017

(54) REDUCING LINER CORROSION DURING METALLIZATION OF SEMICONDUCTOR DEVICES

(71) Applicant: GLOBALFOUNDRIES Inc., Grand Caymay (KY)

(72) Inventors: Zhiguo Sun, Halfmoon, NY (US);
Qiang Fang, Ballston Lake, NY (US);
Huang Liu, Mechanicville, NY (US);
Haigou Huang, Rexford, NY (US);
Jiehui Shu, Clifton Park, NY (US); Jin Ping Liu, Ballston Lake, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/822,597

(22) Filed: Aug. 10, 2015

(65) Prior Publication Data

US 2017/0047282 A1  Feb. 16, 2017

(51) Int. Cl.
| | |
|---|---|
| *H01L 21/76* | (2006.01) |
| *H01L 23/528* | (2006.01) |
| *H01L 21/3065* | (2006.01) |
| *H01L 21/768* | (2006.01) |
| *H01L 23/532* | (2006.01) |

(Continued)

(52) U.S. Cl.
CPC ........ *H01L 23/528* (2013.01); *H01L 21/3065* (2013.01); *H01L 21/321* (2013.01); *H01L 21/3212* (2013.01); *H01L 21/7684* (2013.01); *H01L 21/7685* (2013.01); *H01L 21/76853* (2013.01); *H01L 23/5226* (2013.01); *H01L 23/53204* (2013.01); *H01L 23/53238* (2013.01); *H01L 23/53266* (2013.01)

(58) Field of Classification Search
CPC ......... H01L 21/76849; H01L 21/76843; H01L 21/76805; H01L 21/76814; H01L 21/76846; H01L 23/53238
See application file for complete search history.

(56) References Cited

U.S. PATENT DOCUMENTS

| | | | |
|---|---|---|---|
| 6,706,625 B1 * | 3/2004 | Sudijono | ........... H01L 21/76849 438/619 |
| 2011/0049716 A1 * | 3/2011 | Yang | ................... C23C 16/0272 257/751 |

(Continued)

OTHER PUBLICATIONS

Fangyu Wu, et al., "Low-Temperature Etching of Cu by Hydrogen-Based Plasmas," Applied Materials & Interfaces, vol. 2, No. 8, 2010, pp. 2175-2179.

*Primary Examiner* — Whitney T Moore
*Assistant Examiner* — Joseph Galvin, III
(74) *Attorney, Agent, or Firm* — Wayne F. Reinke, Esq.; Heslin Rothenberger Farley & Mesiti P.C.

(57) ABSTRACT

Reducing liner corrosion during metallization of semiconductor devices at BEOL includes providing a starting metallization structure, the structure including a bottom layer of dielectric material with a via therein, a liner lining the via and extending over upper edges thereof, the lined via over filled with a conductive material, recessing the conductive material down to the liner, further selectively recessing the conductive material below the upper edges of the via without damaging the liner, and forming a cap of the liner material on the conductive material.

20 Claims, 3 Drawing Sheets

(51) Int. Cl.
*H01L 23/522* (2006.01)
*H01L 21/321* (2006.01)

(56) References Cited

U.S. PATENT DOCUMENTS

2013/0341620 A1* 12/2013 Birner .................... H01L 22/30
  257/48
2015/0056385 A1* 2/2015 Ishizaka ................. H01L 23/00
  427/576

* cited by examiner

REDUCING LINER CORROSION DURING METALLIZATION OF SEMICONDUCTOR DEVICES

BACKGROUND OF THE INVENTION

Technical Field

The present invention generally relates to fabrication of semiconductor devices. More particularly, the present invention relates to metallization of semiconductor devices at the Back End of the Line (BEOL).

Background Information

As semiconductor device size continues to shrink, making real-world electrical connections to the smaller feature sizes at BEOL also becomes more challenging. Known generally as metallization, a number of layers may be used. For example, copper voids can seriously impact device yield. To get good copper seeding and reduce the copper voids, a cobalt and/or ruthenium liner is used. However, current copper planarization processes include chemicals that attack the liner, resulting in post-planarization corrosion, creating a divot or void. The divot/void can cause reliability issues and device degradation.

Thus, a need continues to exist for reduced liner corrosion during metallization of semiconductor devices at BEOL.

SUMMARY OF THE INVENTION

The shortcomings of the prior art are overcome and additional advantages are provided through the provision, in one aspect, of a method of reducing liner corrosion during metallization of semiconductor devices at BEOL. The method comprises providing a starting metallization structure, the starting metallization structure comprising a bottom layer of dielectric material with a via therein, the via lacking penetration through the bottom layer of dielectric material, the semiconductor metallization structure further comprising a liner lining the via and extending over upper edges thereof, the lined via over filled with a conductive material, the liner comprising an outer liner and an inner liner over the outer liner. The method further comprises recessing the conductive material down to a top surface of the outer liner, further recessing the conductive material below the upper edges of the via, and forming a liner material cap over the inner liner and the conductive material, the liner material cap comprising a liner material of the inner liner, and a top surface of the liner material cap being coplanar with a top surface of the bottom dielectric layer.

In accordance with another aspect, an intermediate metallization structure for semiconductor devices is provided, the structure comprising a bottom layer of dielectric material with a via therein, the via lacking penetration through the bottom layer of dielectric material, the semiconductor metallization structure further comprising a liner lining the via and extending past upper edges of the via, the liner comprising an outer liner and an inner liner over the outer liner, and the inner liner ending at the upper edges, and conductive material filling a majority but less than all of the lined via.

These, and other objects, features and advantages of this invention will become apparent from the following detailed description of the various aspects of the invention taken in conjunction with the accompanying drawings.

DETAILED DESCRIPTION OF THE INVENTION

Figure 1:
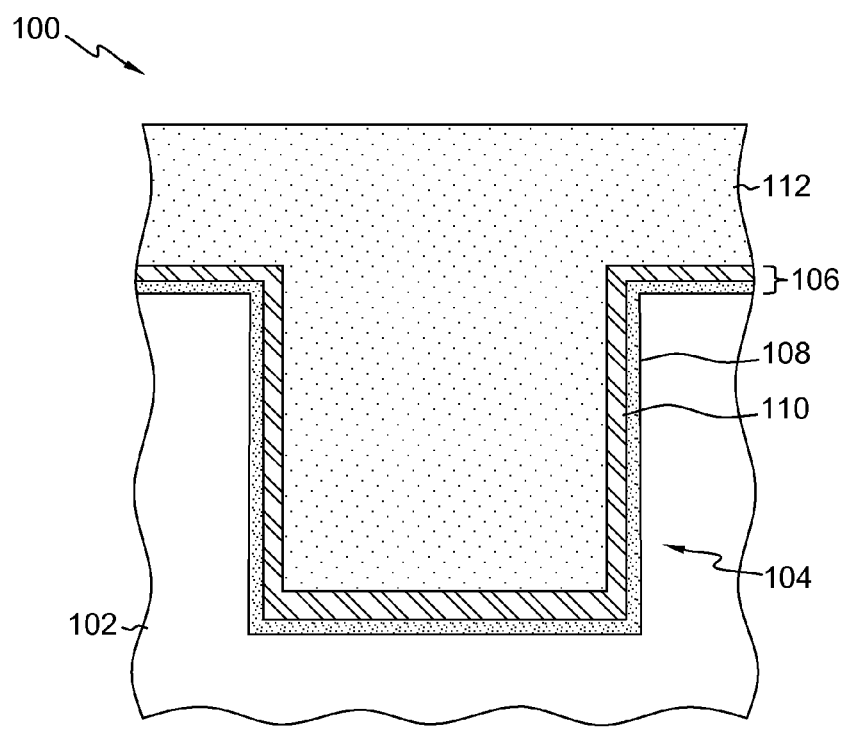
FIG. 1 is a cross-sectional view of one example of a starting metallization structure for electrically coupling to one or more semiconductor devices, the structure including a bottom layer of dielectric material with a via therein, the via being lined with a liner, the liner including an outer layer of titanium nitride, tantalum or titanium nitride, and an inner layer of cobalt or ruthenium, the liner extending over the top edges onto the dielectric layer, and the lined via being overfilled with a conductive material (e.g., copper, tungsten or cobalt), in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Reference is made below to the drawings, which are not drawn to scale for ease of understanding, wherein the same reference numbers are used throughout different figures to designate the same or similar components.

FIG. 1 is a cross-sectional view of one example of a starting metallization structure 100 for electrically coupling to one or more semiconductor devices below (not shown for clarity), the structure including a bottom layer 102 of dielectric material with a via 104 therein, the via being lined with a liner 106, the liner including an outer layer 108 of titanium nitride, tantalum or titanium nitride, and an inner layer 110 of cobalt or ruthenium, the liner extending over the top edges onto the dielectric layer, and the lined via being overfilled with a conductive material 112 (e.g., copper, tungsten or cobalt), in accordance with one or more aspects of the present invention.

The starting structure may be conventionally fabricated, for example, using known processes and techniques. Further, unless noted otherwise, conventional processes and techniques may be used to achieve individual aspects of the present invention.

Figure 2:
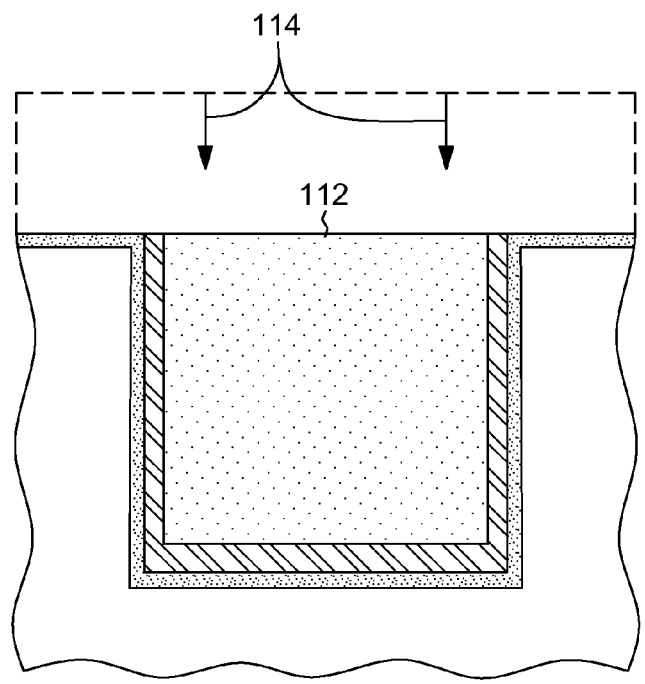
FIG. 2 depicts one example of the structure of FIG. 1 after recessing the conductive material and part of the liner, for example, employing a chemical-mechanical polishing process and stopping on the outer liner 108, in accordance with one or more aspects of the present invention.

FIG. 2 depicts one example of the structure of FIG. 1 after recessing 114 the conductive material 112 and part of the liner (i.e., inner layer 110), for example, employing a chemical-mechanical polishing process and stopping on the outer liner layer 108, in accordance with one or more aspects of the present invention.

Figure 3:
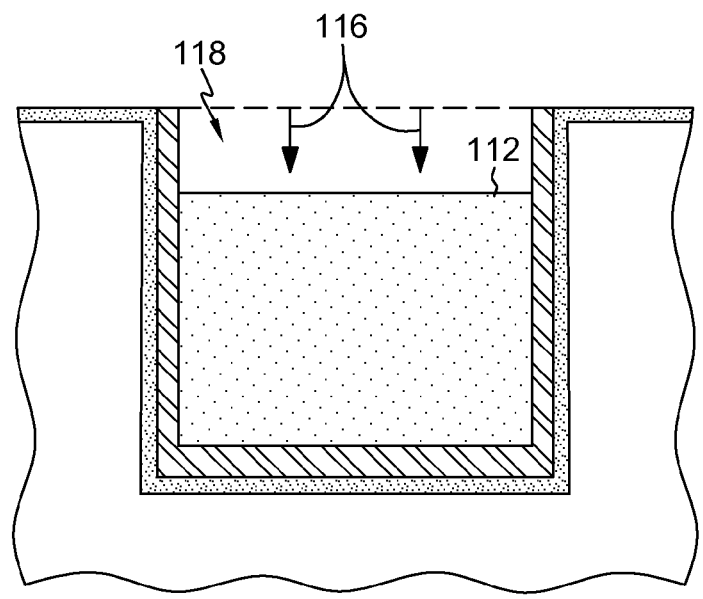
FIG. 3 depicts one example of the structure of FIG. 2 after further selectively recessing the conductive material, without damaging the liner, leaving an opening, in accordance with one or more aspects of the present invention.

FIG. 3 depicts one example of the structure of FIG. 2 after further selectively recessing 116 the conductive material 112, without damaging the liner, leaving an opening 118, in accordance with one or more aspects of the present invention.

Figure 4:
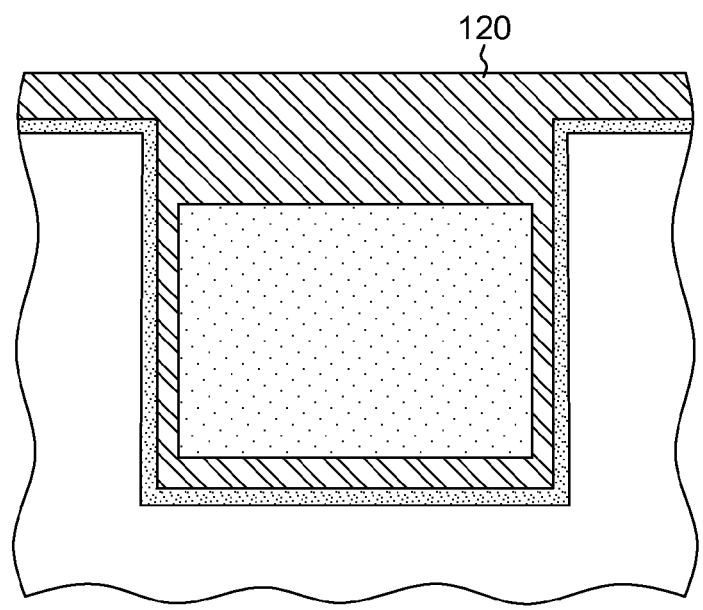
FIG. 4 depicts one example of the structure of FIG. 3 after over filling the opening with the inner liner material, in accordance with one or more aspects of the present invention.

FIG. 4 depicts one example of the structure of FIG. 3 after over filling the opening (118, FIG. 3) with the inner liner material 120, in accordance with one or more aspects of the present invention.

Figure 5:
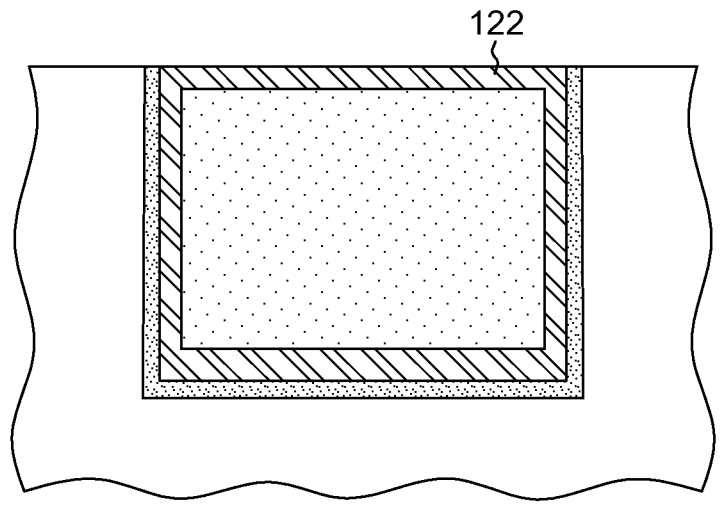
FIG. 5 depicts one example of the structure of FIG. 4 after planarizing to create a cap of the inner liner material, in accordance with one or more aspects of the present invention.

FIG. 5 depicts one example of the structure of FIG. 4 after planarizing to create a cap 122 of the inner liner material, in accordance with one or more aspects of the present invention. The planarization may be accomplished using, for example, a chemical-mechanical polishing process and stopping on, for example, the outer layer 108 of the liner or other barrier.

Figure 6:
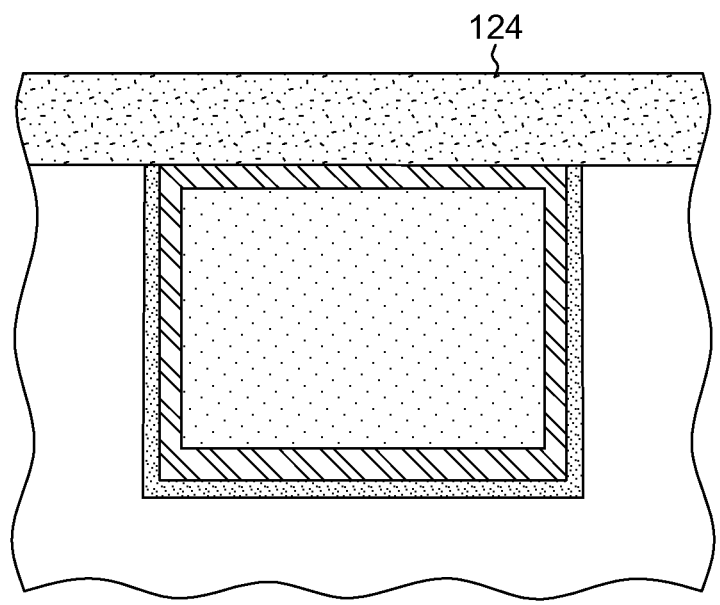
FIG. 6 depicts one example of the structure of FIG. 5 after forming a dielectric cap on the planarized surface, in accordance with one or more aspects of the present invention.

FIG. 6 depicts one example of the structure of FIG. 5 after forming a dielectric cap 124 on the planarized surface, in accordance with one or more aspects of the present invention. The dielectric may be the same or different from dielectric 102 in FIG. 1.

In a first aspect, disclosed above is a method. The method includes providing a starting metallization structure, the structure including a bottom layer of dielectric material with a via therein, and a liner lining the via and extending over upper edges thereof, the lined via being over filled with a conductive material. The method further includes recessing the conductive material down to the liner, further selectively recessing the conductive material below the upper edges of the via without damaging the liner, and forming a cap of the liner material on the conductive material.

In one example, the further recessing creates an opening, and forming the liner material cap includes over filling the opening with the liner material, and planarizing to create the liner material cap. In one example, the planarizing may include, for example, employing a chemical-mechanical polish.

In one example, the method of the first aspect may further include, for example, forming a dielectric cap above the liner material cap.

In one example, the bottom layer of dielectric material in the method of the first aspect has a dielectric constant of less than 3.9 (low-k). In another example, the dielectric constant is less than 2.2 (ultra low-k).

In one example, the conductive material in the method of the first aspect may include, for example, a metal. In one example, the metal may include, for example, copper. In another example, the metal may include, for example, tungsten. In yet another example, the metal may include, for example, cobalt.

In one example, the liner in the method of the first aspect may include, for example, an inner layer of cobalt or ruthenium, and an outer layer of one of tantalum nitride, tantalum and titanium nitride, the recessing down to the liner including recessing down to the outer layer, and forming the liner material cap includes forming a cap of a same material as the inner layer.

In one example, the recessing in the method of the first aspect may include, for example, employing a chemical-mechanical polish.

In one example, the further recessing in the method of the first aspect may include, for example, employing reactive ion etching. In another example, the further recessing in the method of the first aspect may include, for example, employing reverse electro-chemical plating.

In a second aspect, disclosed above is an intermediate metallization structure for semiconductor devices. The structure includes a bottom layer of dielectric material with a via therein, a liner lining the via and extending past upper edges of the via, and conductive material filling a majority but less than all of the lined via.

In one example, the intermediate metallization structure of the second aspect may further include, for example, a layer of the liner over the conductive material.

In one example, the dielectric material in the intermediate metallization structure of the second aspect may include, for example, a low-k dielectric or ultra-low-k dielectric.

In one example, the liner of the intermediate metallization structure of the second aspect may include, for example, an outer layer of tantalum nitride, tantalum or titanium nitride, and an inner layer of cobalt or ruthenium.

In one example, the conductive material of the intermediate metallization structure of the second aspect may include, for example, copper.

In one example, the conductive material of the intermediate metallization structure of the second aspect may include, for example, tungsten or cobalt.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A method, comprising:
   providing a starting metallization structure, the starting metallization structure comprising a bottom layer of dielectric material with a via therein, wherein the via lacks penetration through the bottom layer of dielectric material, the semiconductor metallization structure further comprising a liner lining the via and extending over upper edges thereof, the lined via over filled with a conductive material, wherein the liner comprises an outer liner and an inner liner over the outer liner;
   recessing the conductive material down to a top surface of the outer liner;
   further selectively recessing the conductive material below the upper edges of the via without damaging the liner; and
   forming a liner material cap over the inner liner and the conductive material, wherein the liner material cap comprises a liner material of the inner liner, and wherein a top surface of the liner material cap is coplanar with a top surface of the bottom dielectric layer.

2. The method of claim 1, wherein the further selectively recessing creates an opening, and wherein forming the liner material cap comprises:
   over filling the opening with the liner material of the inner liner; and
   planarizing to create the liner material cap.

3. The method of claim 2, wherein the planarizing comprises employing a chemical-mechanical polish.

4. The method of claim 1, further comprising forming a dielectric cap above the structure.

5. The method of claim 1, wherein the bottom layer of dielectric material has a dielectric constant of less than 3.9.

6. The method of claim 5, wherein the dielectric constant is less than 2.2.

7. The method of claim 1, wherein the conductive material comprises a metal.

8. The method of claim 7, wherein the metal comprises copper.

9. The method of claim 7, wherein the metal comprises tungsten.

10. The method of claim 7, wherein the metal comprises cobalt.

11. The method of claim 1, wherein the inner liner comprises cobalt or ruthenium, and wherein the outer liner comprises one of tantalum nitride, tantalum and titanium nitride.

12. The method of claim 1, wherein the recessing comprises employing a chemical-mechanical polish.

13. The method of claim 1, wherein the further recessing comprises employing reactive ion etching.

14. The method of claim 1, wherein the further recessing comprises employing reverse electro-chemical plating.

15. An intermediate metallization structure for semiconductor devices, the structure comprising:
   a bottom layer of dielectric material with a via therein, wherein the via lacks Penetration through the bottom layer of dielectric material, the semiconductor metallization structure further comprising:
   a liner lining the via and extending past upper edges of the via, wherein the liner comprises an outer liner and an inner liner over the outer liner, and wherein the inner liner ends at the upper edges; and
   conductive material filling a majority but less than all of the lined via.

16. The intermediate metallization structure of claim 15, further comprising a layer of a material of the inner liner over the conductive material and the inner liner.

17. The intermediate metallization structure of claim 15, wherein the dielectric material comprises a low-k dielectric or ultra-low-k dielectric.

18. The intermediate metallization structure of claim 15, wherein the outer liner comprises tantalum nitride, tantalum or titanium nitride, and wherein the inner liner comprises cobalt or ruthenium.

19. The intermediate metallization structure of claim 15, wherein the conductive material comprises copper.

20. The intermediate metallization structure of claim 15, wherein the conductive material comprises tungsten or cobalt.

* * * * *